US012748155B2

(12) United States Patent
Hori et al.

(10) Patent No.: US 12,748,155 B2
(45) Date of Patent: Sep. 29, 2026

(54) BATTERY REMAINING QUANTITY ESTIMATION APPARATUS

(71) Applicant: DENSO CORPORATION, Kariya-city (JP)

(72) Inventors: Yuki Hori, Kariya-city (JP); Masaki Uchiyama, Kariya-city (JP); Taisuke Kurachi, Kariya-city (JP)

(73) Assignee: DENSO CORPORATION, Kariya (JP)

( * ) Notice: Subject to any disclaimer, the term of this patent is extended or adjusted under 35 U.S.C. 154(b) by 157 days.

(21) Appl. No.: 18/908,135

(22) Filed: Oct. 7, 2024

(65) Prior Publication Data

US 2025/0028002 A1 Jan. 23, 2025

Related U.S. Application Data

(63) Continuation of application No. PCT/JP2023/010977, filed on Mar. 20, 2023.

(30) Foreign Application Priority Data

Apr. 7, 2022 (JP) ................................ 2022-064055

(51) Int. Cl.
*G01R 31/3842* (2019.01)
*G01R 31/378* (2019.01)
(Continued)

(52) U.S. Cl.
CPC ....... *G01R 31/3842* (2019.01); *G01R 31/378* (2019.01); *G01R 31/392* (2019.01); *H01M 10/0525* (2013.01); *H01M 10/4285* (2013.01)

(58) Field of Classification Search
CPC ...... G01R 31/00; G01R 31/36; G01R 31/367; G01R 31/378; G01R 31/382;
(Continued)

(56) References Cited

U.S. PATENT DOCUMENTS 8,093,902 B2 * 1/2012 Nishi .................... H01M 10/44 324/426
12,474,410 B2 * 11/2025 Oonishi .............. G01R 31/382
(Continued)

FOREIGN PATENT DOCUMENTS

CN 107250824 A * 10/2017 ................ H02J 7/82
CN 114243811 A * 3/2022 ................ H02J 7/96
(Continued)

*Primary Examiner* — Hoai-An D. Nguyen
(74) *Attorney, Agent, or Firm* — Oliff PLC

(57) ABSTRACT

A battery remaining quantity estimation apparatus estimates a remaining quantity of a secondary battery based on a charging parameter correlated with charging time of the secondary battery and a rate of change of a voltage of the secondary battery relative to the charging parameter. This estimation apparatus determines whether a predetermined condition is met. The predetermined condition is that an amount of change in the charging parameter from the start of charging of the secondary battery until when the rate of change of the voltage becomes a maximum value is equal to or less than a predetermined amount of change. In response to determining that the predetermined condition is met, the estimation apparatus estimates a remaining quantity corresponding to a portion between two minimum values of the rate of change of the voltage during charging of the secondary battery as the remaining quantity of the secondary battery.

20 Claims, 10 Drawing Sheets

(51) Int. Cl.
*G01R 31/392* (2019.01)
*H01M 10/0525* (2010.01)
*H01M 10/42* (2006.01)

(58) Field of Classification Search
CPC ............ G01R 31/3828; G01R 31/3842; G01R 31/385; G01R 31/387; G01R 31/389; G01R 31/392; H01M 4/00; H01M 4/02; H01M 4/36; H01M 4/58; H01M 10/00; H01M 10/05; H01M 10/052; H01M 10/0525; H01M 10/42; H01M 10/4285; H01M 10/48; H02J 7/00; Y02E 60/00; Y02E 60/10
USPC .................................................. 324/425, 426
See application file for complete search history.

(56) References Cited

U.S. PATENT DOCUMENTS

| | | | |
|---|---|---|---|
| 2014/0125345 | A1 | 5/2014 | Sejima et al. |
| 2021/0152010 | A1 | 5/2021 | Nagai et al. |
| 2023/0333173 | A1 | 10/2023 | Hori et al. |
| 2024/0159835 | A1 | 5/2024 | Uchiyama et al. |

FOREIGN PATENT DOCUMENTS

| | | | | | |
|---|---|---|---|---|---|
| CN | 118465589 | A | * | 8/2024 | ......... G01R 31/3648 |
| JP | 5051661 | B2 | * | 10/2012 | ........... G01R 31/392 |
| JP | 2013120185 | A | * | 6/2013 | ........... G01R 31/392 |
| JP | 6022192 | B2 | * | 11/2016 | ........... G01R 31/382 |
| JP | 7521907 | B2 | * | 7/2024 | ............ H01M 10/48 |
| WO | 2023/008061 | A1 | | 2/2023 | |

* cited by examiner

| BATTERY TEMPERATURE | −30 | −10 | 0 | 20 | 40 | 60 |
|---|---|---|---|---|---|---|
| PREDETERMINED VALUE | SMALL ← | | | | | → LARGE |

BATTERY REMAINING QUANTITY ESTIMATION APPARATUS

CROSS-REFERENCE TO RELATED APPLICATION

The present application is a continuation application of International Application No. PCT/JP2023/010977, filed on Mar. 20, 2023, which claims priority to Japanese Patent Application Japanese Patent Application No. 2022-064055, filed on Apr. 7, 2022. The contents of these applications are incorporated herein by reference in their entirety.

BACKGROUND

The present disclosure relates to an apparatus that estimates a remaining quantity of a secondary battery. Conventionally, there is an apparatus that, upon appearance of a singular point at which an amount of change (rate of change) in a voltage of a secondary battery detected by a voltage detecting unit becomes a maximum value, estimates a remaining capacity of the secondary battery at this time to be a remaining capacity corresponding to the singular point.

SUMMARY

One aspect of the present disclosure provides a battery remaining quantity estimation apparatus that estimates a remaining quantity of a secondary battery based on a charging parameter correlated with charging time of the secondary battery and a rate of change of a voltage of the secondary battery relative to the charging parameter. The battery remaining quantity estimation apparatus determines whether a predetermined condition is met. The predetermined condition is that an amount of change in the charging parameter from the start of charging of the secondary battery until when the rate of change of the voltage becomes a maximum value is equal to or less than a predetermined amount of change. In response to determining that the predetermined condition is met, the battery remaining quantity estimation apparatus estimates a remaining quantity corresponding to a portion between two minimum values of the rate of change of the voltage during charging of the secondary battery as the remaining quantity of the secondary battery.

BRIEF DESCRIPTION OF DRAWINGS

In the accompanying drawings:

FIG. 16 is a graph illustrating an aspect in which the capacity A is detected based on a derivative of the real part of the impedance; and FIG. 17 is a table of a relationship between battery temperature and the predetermined value a.

DESCRIPTION OF THE EMBODIMENTS

Figure 1:
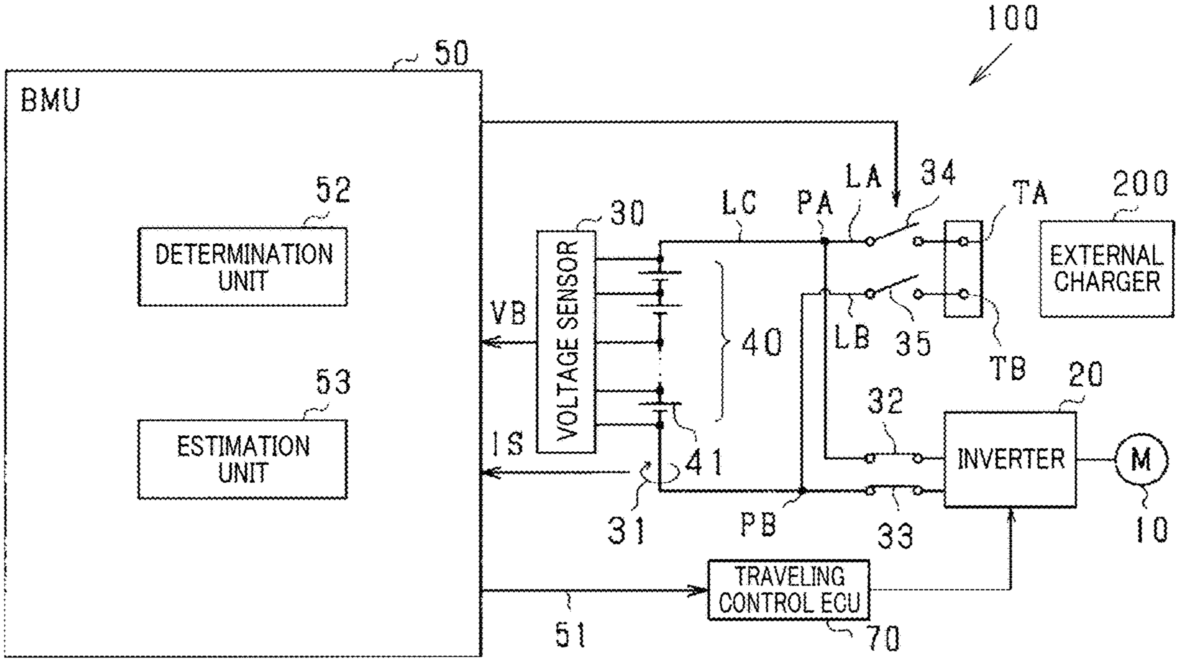
FIG. 1 is a circuit diagram illustrating a configuration of a battery control apparatus.

JP 2014-167457 A discloses an apparatus that, upon appearance of a singular point at which an amount of change (rate of change) in a voltage of a secondary battery detected by a voltage detecting unit becomes a maximum value, estimates a remaining capacity of the secondary battery at this time to be a remaining capacity corresponding to the singular point.

Incidentally, the discloser of the present invention has focused on the remaining capacity (remaining quantity) upon appearance of the singular point deviating from the remaining capacity corresponding to the singular point depending on a state of charge of the secondary battery until detection of the singular point, when the singular point is detected during charging of the secondary battery.

It is thus desired to suppress decrease in accuracy with which a remaining quantity of a secondary battery is estimated in a battery remaining quantity estimation apparatus that estimates the remaining quantity of the secondary battery based on a rate of change of a voltage of the secondary battery.

A first exemplary embodiment provides a battery remaining quantity estimation apparatus that estimates a remaining quantity of a secondary battery based on a charging parameter correlated with charging time of the secondary battery and a rate of change of a voltage of the secondary battery relative to the charging parameter. The battery remaining quantity estimation apparatus includes: a determination unit that determines whether a predetermined condition is met, the predetermined condition being that an amount of change in the charging parameter from the start of charging of the secondary battery until when the rate of change of the voltage becomes a maximum value is equal to or less than a predetermined amount of change; and an estimation unit that, in response to the determination unit determining that the predetermined condition is met, estimates a remaining quantity corresponding to a portion between two minimum values of the rate of change of the voltage during charging of the secondary battery as the remaining quantity of the secondary battery.

As a result of the above-described configuration, the battery remaining quantity estimation apparatus estimates the remaining quantity of the secondary battery based on the charging parameter correlated with the charging time of the secondary battery and the rate of change of the voltage of the secondary battery relative to the charging parameter. Specifically, as described in JP 2014-167457 A, the remaining quantity of the secondary battery can be estimated based on a specific remaining quantity that is the remaining quantity of the secondary battery when the rate of change of the voltage of the secondary battery relative to the charging parameter is a maximum value.

Here, the discloser of the present invention has focused on the remaining quantity when the rate of change of the voltage during charging becomes the maximum value deviating a specific remaining quantity, when the amount of change (referred to, hereafter as a "charging parameter change amount from the start of charging") in the charging parameter from the start of charging until the rate of change of the voltage becomes the maximum value increases. In this regard, the determination unit determines whether the predetermined condition is met, the predetermined condition being that the amount of change in the charging parameter, from the start of charging of the secondary battery until the rate of change of the voltage becomes the maximum value, is equal to or less than a predetermined value. Therefore, the determination unit can determine that the charging parameter change amount from the start of charging is not large based on the amount of change in the charging parameter from the start of charging until the rate of change of the voltage becomes the maximum value.

Then, in response to the determination unit determining that the predetermined condition is met, the estimation unit estimates a remaining quantity corresponding to a portion between two minimum values of the rate of change of the voltage during charging of the secondary battery as the remaining quantity of the secondary battery. In addition, a maximum value is present between the two minimum values of the rate of change of the voltage during charging, and the remaining quantity corresponding to the portion between the two minimum values is close to the specific remaining quantity corresponding to the maximum value. Therefore, the remaining quantity close to the specific remaining quantity can be estimated as the remaining quantity of the secondary battery in a state in which the charging parameter change amount from the start of charging is not large. Consequently, decrease in accuracy with which the remaining quantity of the secondary battery is estimated can be suppressed.

Specifically, as according to a second exemplary embodiment, a configuration in which the charging parameter is an integrated current value in which current and time are integrated can be used. As a result of a configuration such as this, the charging parameter can be calculated using a general-purpose element such as a current sensor that detects a current, or a clock of a central processing unit (CPU).

A high-resistance portion and a low-resistance portion are present inside the secondary battery. When charging/discharging is performed, the current is concentrated in the low-resistance portion, and a portion in which the capacity (an amount of stored power) is high and a portion in which the capacity is low are formed in a localized manner (capacity unevenness occurs). In addition, the discloser of the present invention has focused on the remaining quantity when the rate of change of the voltage during charging becomes the maximum value deviating from the specific remaining quantity when capacity unevenness occurs. Capacity unevenness is easily resolved when the rate of change of the voltage relative to the charging parameter exceeds a high rate-of-change portion that is higher than a predetermined rate of change. Conversely, capacity unevenness is not easily resolved in a low rate-of-change portion in which the rate of change of the voltage relative to the charging parameter is equal to or lower than the predetermined rate of change. Consequently, capacity unevenness more easily occurs as charging in the low rate-of-change portion becomes longer. The remaining quantity when the rate of change of the voltage during charging becomes the maximum value easily deviates from the specific remaining quantity.

In this regard, according to a third exemplary embodiment, the predetermined amount of change is set to less than the charging parameter corresponding to a width of the low rate-of-change portion having a lower voltage of the secondary battery, of two low rate-of-change portions in which the rate of change of the voltage is equal or less than the predetermined rate of change. Therefore, the remaining quantity of the secondary battery can be estimated in a state in which the charging parameter change amount from the start of charging is less than the charging parameter corresponding to the width of the low rate-of-change portion having the lower voltage. Consequently, the remaining quantity when the rate of change of the voltage during charging becomes the maximum value deviating from the specific remaining quantity can be suppressed. Decrease in accuracy with which the remaining quantity of the secondary battery is estimated can be suppressed.

Capacity unevenness is more easily resolved as a temperature of the secondary battery increases and less easily resolved as the temperature of the secondary battery decreases.

In this regard, according to a fourth exemplary embodiment, the predetermined amount of change is set to a smaller amount of change as a temperature of the secondary battery decreases. As a result of a configuration such as this, the charging parameter change amount from the start of charging can be required to be smaller as the temperature of the secondary battery decreases as the predetermined condition. Consequently, even in cases in which the temperature of the secondary battery is low, decrease in accuracy with which the remaining quantity of the secondary battery is estimated can be suppressed.

Capacity unevenness more easily occurs as the current with which the secondary battery is charged increases and less easily occurs as the current with which the secondary battery is charged decreases.

In this regard, according to a fifth exemplary embodiment, the predetermined amount of change is set to a smaller amount of change as a current with which the secondary battery is charged increases. As a result of a configuration such as this, the charging parameter change amount from the start of charging can be required to be smaller as the current with which the secondary battery is charged increases as the predetermined condition. Consequently, even in cases in which the current with which the secondary battery is charged is large, decrease in accuracy with which the remaining quantity of the secondary battery is estimated can be suppressed.

According to a sixth exemplary embodiment, the determination unit determines that the rate of change of the voltage is a maximum value when, after the start of charging of the secondary battery, the rate of change of the voltage exceeds a second predetermined value (B) that is greater than a first predetermined value from a state in which the rate of change is less than the first predetermined value and subsequently becomes less than a third predetermined value (C) that is less than the second predetermined value.

As a result of the above-described configuration, the rate of change of the voltage becoming the maximum value can be easily determined based on a comparison of magnitude between the rate of change of the voltage and the three predetermined values.

As described above, when the charging parameter change amount from the start of charging increases, the remaining quantity when the rate of change in the voltage during charging becomes the maximum value deviates from the specific remaining quantity. However, even in this case, the remaining quantity of the secondary battery is preferably able to be estimated upon suppression of occurrence of issues, rather than the remaining quantity of the secondary battery not being able to be estimated.

In this regard, according to a seventh exemplary embodiment, the estimation unit estimates, as the remaining quantity of the secondary battery, a remaining quantity in which a remaining quantity corresponding to a portion between two minimum values of the rate of change of the voltage during charging of the secondary battery is decreased, in response to the determination unit determining that the predetermined condition is not met. As a result of a configuration such as this, the remaining quantity of the secondary battery is estimated to be less than when the predetermined condition is met, when the predetermined condition is not met. Consequently, even in cases in which the accuracy with which the remaining quantity of the secondary battery is estimated may decrease, the remaining quantity can be suppressed from becoming depleted earlier than expected, and the remaining quantity of the secondary battery can be estimated.

When a determination is made regarding the rate of change of the voltage of the secondary battery relative to the charging parameter becoming the maximum value, the maximum value becomes difficult to differentiate if the current with which the secondary battery 41 is charged is greater than a predetermined current. In this regard, the discloser of the present invention has focused on a rate of change in a temperature of the secondary battery relative to the charging parameter and a rate of change of an impedance of the secondary battery relative to the charging parameter significantly changing relative to the charging parameter at which the rate of change of the voltage becomes the maximum value during charging of the secondary battery.

In this regard, according to an eighth exemplary embodiment, the determination unit determines that the rate of change of the voltage is the maximum value when the rate of change of the temperature of the secondary battery relative to the charging parameter or the rate of change of the impedance of the secondary battery relative to the charging parameter changes beyond a predetermined degree. As a result of a configuration such as this, even if the current with which the secondary battery is charged is greater than the predetermined current, the rate of change of the voltage of the secondary battery relative to the charging parameter can be determined to be the maximum value.

The rate of change of the voltage of the secondary battery relative to the charging parameter becomes the maximum value as a result of structural changes in a negative electrode of the secondary battery between the two low rate-of-change portions in which the rate of change of the voltage is equal to or less than the predetermined rate of change. Therefore, when the voltage of the secondary battery is lower than the low rate-of-change portion having the lower voltage of the secondary battery, the maximum value of the rate of change of the voltage due to structural changes in the negative electrode of the secondary battery does not occur.

In this regard, according to a ninth exemplary embodiment, the predetermined condition includes the voltage of the secondary battery being higher than a lowest voltage of the secondary battery in the low rate-of-change portion having the lower voltage of the secondary battery, of two low rate-of-change portions in which the rate of change of the voltage is equal to or less than a predetermined rate of change. As a result of a configuration such as this, the maximum value of the rate of change of the voltage due to structural changes in a positive electrode of the secondary battery being erroneously determined to be the maximum value of the rate of change of the voltage due to the structural changes in the negative electrode of the secondary battery can be suppressed.

According to a tenth exemplary embodiment, a state of degradation of the secondary battery is calculated based on a remaining quantity of the secondary battery estimated by the estimation unit, an integrated current value in which current and time are integrated from when the remaining quantity of the secondary battery is estimated until the secondary battery meets a full-charge condition, and a full capacity of the secondary battery in a new state.

As a result of the above-described configuration, the full capacity of the current secondary battery can be calculated by the integrated current value in which the current and the time from when the remaining quantity of the secondary battery is estimated until the secondary battery meets the full-charge condition are integrated being added to the remaining quantity of the secondary battery estimated by the estimation unit. In addition, the state of degradation of the secondary battery can be calculated by a ratio of the full capacity of the current secondary battery to the full capacity of a new secondary battery being calculated.

Specifically, as according to an eleventh exemplary embodiment, a configuration in which the secondary battery is a lithium-ion battery having a negative electrode containing graphite can be used.

Specifically, as according to a twelfth embodiment, a configuration in which the secondary battery is a lithium-ion battery having a positive electrode containing lithium, iron, and phosphorus can be used.

The above-described exemplary embodiments of the present disclosure will be further clarified through the detailed description below, with reference to the accompanying drawings.

First Embodiment

A first embodiment implementing a battery control apparatus that is mounted in an electric vehicle will hereinafter be described with reference to the drawings.

As shown in FIG. 1, a battery control apparatus 100 is an apparatus that monitors a capacity and a state of charge/discharge of a battery 40. The battery 40 is a lithium-ion battery capable of being charged and discharged. Specifically, the battery 40 is an assembled battery in which a plurality of lithium-ion batteries 41 are connected in series. According to the present embodiment, as the lithium-ion battery 41 (secondary battery), a battery using lithium iron phosphate (containing lithium, iron, and phosphorus) as a positive-electrode active material and graphite as a negative-electrode active material is used.

The battery 40 is connected to a rotating electric machine 10 with an inverter 20 therebetween. The rotating electric machine 10 inputs and outputs power to and from the battery 40. During power-running, the rotating electric machine 10 applies a propulsive force to a vehicle using the power supplied from the battery 40. During regeneration, the rotating electric machine 10 generates power using energy from deceleration of the vehicle and outputs the power to the battery 40.

The battery control apparatus 100 includes a voltage sensor 30, a current sensor 31, first to fourth relay switches 32 to 35, and a battery management unit (BMU) 50 that serves as a battery monitoring apparatus.

The voltage sensor 30 detects an inter-terminal voltage of each lithium-ion battery 41 configuring the battery 40 and detects a battery voltage VB that is a sum of the inter-terminal voltages. The current sensor 31 is provided on a connection line LC connecting the battery 40 and the inverter 20. The current sensor 31 detects a magnitude and an orientation of a charge/discharge current IS that is a current flowing into and out from the battery 40. Detection values of the sensors are inputted to the BMU 50.

The battery 40 is configured to be capable of connecting to an external charger 200 by first and second external charging terminals TA and TB. For example, the external charger 200 may be a direct-current (DC) quick charger. When the external charger 200 is connected to the first and second external charging terminals TA and TB, the battery 40 is charged by constant current charging or constant voltage charging by high-voltage, direct-current power inputted from the external charger 200.

The first and second external charging terminals TA and TB are connected to the connection line LC by first and second charging paths LA and LB. Specifically, the first external charging terminal TA is connected to a first contact PA between a positive electrode terminal of the battery 40 and the inverter 20 on the connection line LC by the first charging path LA. The second external charging terminal TB is connected to a second contact PB between a negative electrode terminal of the battery 40 and the inverter 20 on the connection line LC by the second charging path LB.

A first relay switch 32 is provided between the first contact PA and the inverter 20 on the connection line LC. A second relay switch 33 is provided between the second contact PB and the inverter 20 on the connection line LC. The first and second relay switches 32 and 33 perform switching of a connection state between the battery 40 and the rotating electric machine 10. In addition, a third relay switch 34 is provided on the first charging path LA and a fourth relay switch 35 is provided on the second charging path LB. The third and fourth relay switches 34 and 35 perform switching of a connection state between the battery 40 and the external charger 200.

The BMU 50 is a control apparatus configured by a CPU, a read-only memory (ROM), a random access memory (RAM), an input/output (I/O) interface, and the like. The BMU 50 calculates a capacity of the lithium-ion battery 41 (battery 40) based on the detection values input from the sensors. The BMU 50 calculates an SOH indicating a state of degradation of the lithium-ion battery 41 based on the calculated capacity of the lithium-ion battery 41. The SOH [%] is expressed by 100×(current full capacity/full capacity when new) of the lithium-ion battery 41 and indicates a ratio of the full capacity of the current lithium-ion battery 41 to the full capacity of a new lithium-ion battery 41. The BMU 50 includes a determination unit 52 and an estimation unit 53, described hereafter. Here, the determination unit 52 and the estimation unit 53 configure a battery remaining quantity estimation apparatus.

In addition, the BMU 50 is connected to the first to fourth relay switches 32 to 35 and performs switching of the connection state of the first to fourth relay switches 32 to 35 based on the capacity of the battery 40. Furthermore, the BMU 50 is communicably connected to a traveling control electronic control unit (ECU) 70 with an onboard network interface 51 therebetween. The BMU 50 outputs a command to control the rotating electric machine 10 based on the capacity of the battery 40 to the traveling control ECU 70. Based on the command from the BMU 50, the traveling control ECU 70 controls the inverter 20 to control a controlled variable of the rotating electric machine 10 based on the command. For example, the controlled variable may be torque.

Incidentally, as a method for calculating the capacity of the lithium-ion battery 41 (battery 40), a method using state-of-charge (SOC)-OCV characteristics indicating a correlation between the SOC that indicates a state of charge of the lithium-ion battery 41 and an open circuit voltage OCV is known. The open circuit voltage OCV is a voltage between both terminals in a state in which a load is not applied to the lithium-ion battery 41 (a state in which the circuit of the lithium-ion battery 41 is open). Here, the SOC (rate of charging) [%] is expressed by 100×(remaining capacity/full capacity) of the lithium-ion battery 41 and indicates a ratio of the remaining capacity to the full capacity of the lithium-ion battery 41.

According to the present embodiment, a battery using lithium iron phosphate as the positive-electrode active material and graphite as the negative-electrode active material is used as the lithium-ion battery 41 configuring the battery 40. In the lithium-ion battery 41 using these active materials, the open circuit voltage OCV is stable over a wide range of the SOC (or battery capacity). The lithium-ion battery 41 has a region in which changes in the open circuit voltage OCV accompanying changes in the SOC are small, that is, a plateau region PR. In the plateau region PR (low rate-of-change portion), a rate of change of the open circuit voltage OCV (predetermined parameter) relative to the capacity (remaining quantity) of the lithium-ion battery 41 (remaining quantity) is equal to or less than a predetermined rate of change. In the plateau region PR, calculating the SOC and the capacity of the lithium-ion battery 41 using the SOC-OCV characteristics is difficult.

Figure 2:
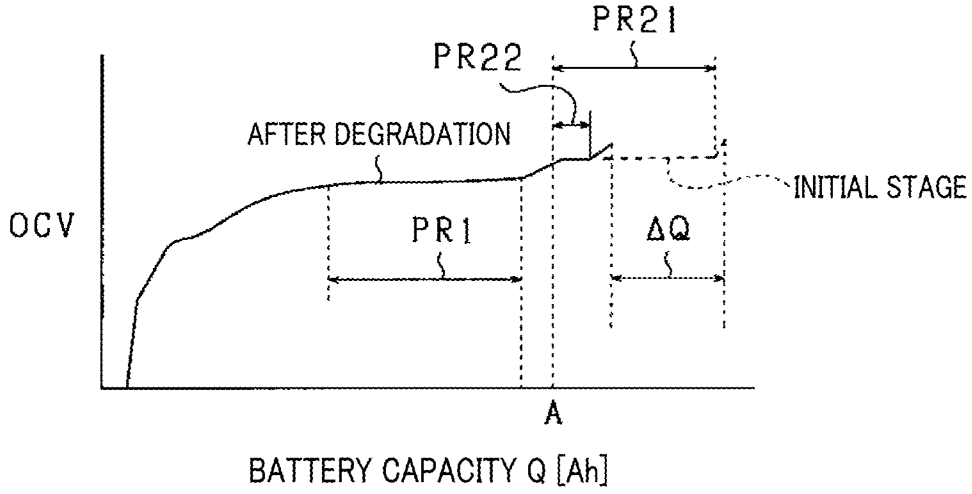
FIG. 2 is a graph illustrating a relationship between battery capacity and an open circuit voltage (OCV) at an initial stage and after degradation.

FIG. 2 is a graph of a relationship between a capacity Q of the lithium-ion battery 41 and the OCV at an initial stage and after degradation. A rate of change Rv of the open circuit voltage OCV (also similarly applies to a closed circuit voltage [CCV]) relative to the capacity of the lithium-ion battery 41 between a plateau region PR1 and plateau regions PR21 and PR22 is greater than the rate of change Rv in the plateau regions PR1, PR21, and PR22. Specifically, the rate of change Rv is a maximum value at a capacity A between the plateau region PR1 and the plateau regions PR21 and PR22 (see broken line in FIG. 3). In addition, the capacity A (specific remaining quantity) of the lithium-ion battery 41 when the rate of change Rv is the maximum value is substantially the same between the lithium-ion battery 41 at the initial stage and the lithium-ion battery 41 after degradation. Therefore, when the rate of change Rv is the maximum value, the capacity of the lithium-ion battery 41 at this time can be estimated to be the capacity A. The capacity A is a capacity prescribed by structural changes in a negative electrode of the lithium-ion battery 41. Details thereof will be described hereafter.

Figure 3:
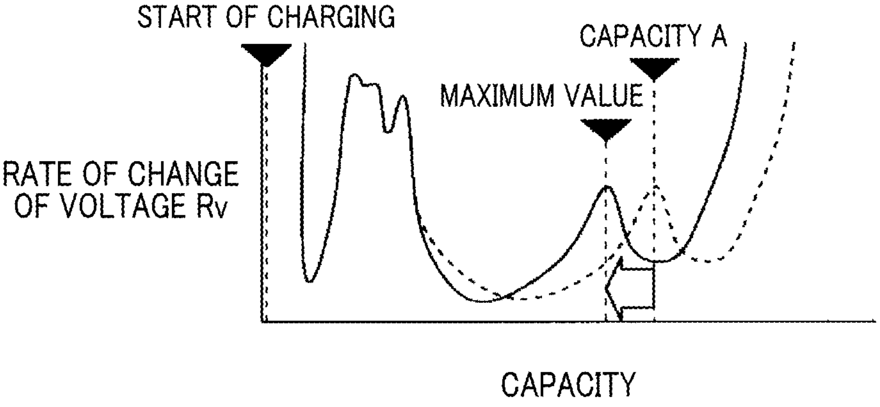
FIG. 3 is a graph illustrating an aspect in which a maximum value of a rate of change of voltage corresponding to a capacity A shifts.

Here, the discloser of the present invention has focused on the capacity when the rate of change Rv of the OCV becomes the maximum value (changes in a specific manner) during charging deviating from the capacity A if an amount of change in the capacity (charging parameter) from the start of charging of the lithium-ion battery 41 until the rate of change Rv of the OCV (also similarly applies to the CCV) becomes the maximum value increases. FIG. 3 is a graph of an aspect in which the maximum value of the rate of change Rv corresponding to the capacity A shifts. FIG. 3 shows an example in which charging is started from a state in which the capacity of the lithium-ion battery 41 is close to zero. The capacity when the rate of change Rv is the maximum value shifts from the capacity A toward a low-capacity side. In this case, if the capacity of the lithium-ion battery 41 when the rate of change Rv is the maximum value is estimated as the capacity A, the estimated capacity deviates from the correct capacity.

Figure 4:
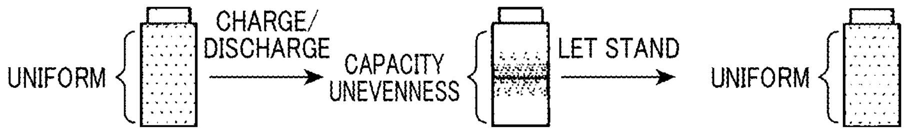
FIG. 4 is a schematic diagram illustrating capacity unevenness in a lithium-ion battery.

FIG. 4 is a schematic diagram of capacity unevenness in the lithium-ion battery 41. As shown on the left-hand side in FIG. 4, an internal capacity of the lithium-ion battery 41 becomes uniform when the lithium-ion battery 41 is left standing for a long period of time without being charged or discharged (in a state in which a charge/discharge speed is less than a predetermined speed).

Next, when the lithium-ion battery 41 is charged/discharged, as shown in FIG. 4, a high-capacity portion and a low-capacity portion are formed inside the lithium-ion battery 41 (capacity unevenness occurs). A reason capacity unevenness occurs is because a high-resistance portion and a low-resistance portion are present inside the lithium-ion battery 41, and the current is concentrated in the low-resistance portion when charging/discharging is performed.

Subsequently, when the lithium-ion battery 41 is left standing without being charged/discharged, as shown on the right-hand side in FIG. 4, the internal capacity of the lithium-ion battery 41 becomes more uniform as the time over which the lithium-ion battery 41 is left standing increases.

Figure 5:
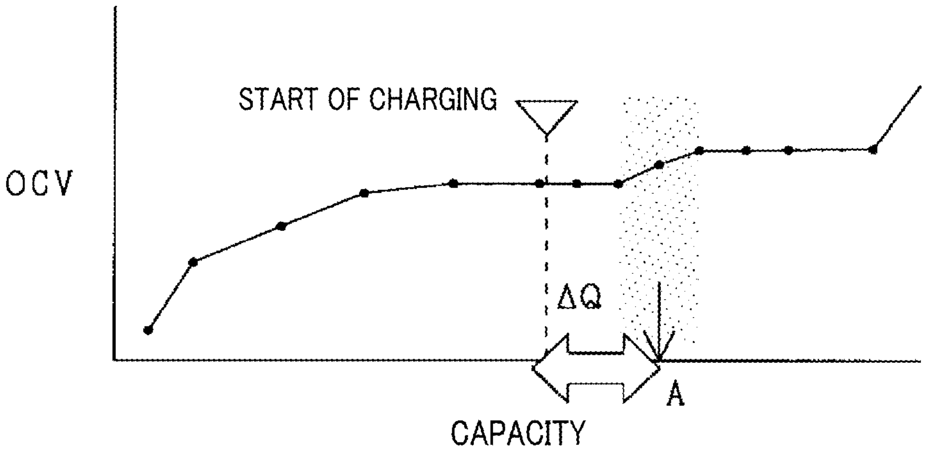
FIG. 5 is a graph illustrating a state of charge suitable for detection of the capacity A.

FIG. 5 is a graph of a state of charge suitable for detection of the capacity A. When an amount of increase $\Delta Q$ (amount of change) in the capacity of the lithium-ion battery 41 from the start of charging until the capacity A is small, capacity unevenness does not easily occur and the state is suitable for detection of the capacity A during charging. For example, the amount of increase $\Delta Q$ in the capacity of the lithium-ion battery 41 can be calculated by an integrated current value (charging parameter) in which current and time are integrated.

Figure 6:
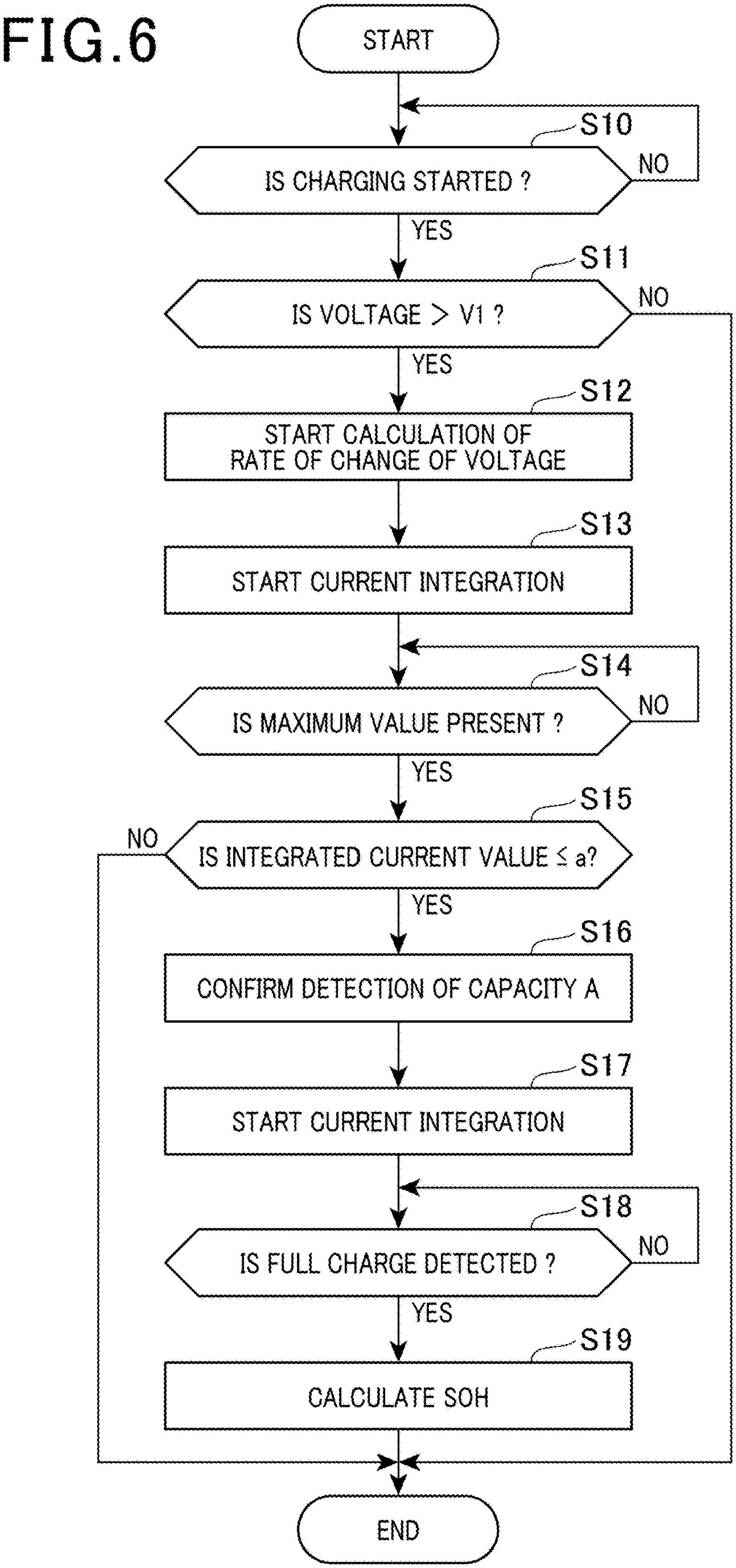
FIG. 6 is a flowchart illustrating processes for capacity A detection and state-of-health (SOH) calculation.

FIG. 6 is a flowchart of processes for capacity A detection and SOH calculation. This series of processes is performed by the BMU 50.

First, whether charging of the lithium-ion battery 41 (battery 40) is started is determined (S10). When charging of the lithium-ion battery 41 is determined to not be started in this determination (NO at S10), the process at S10 is performed again.

Figure 7:
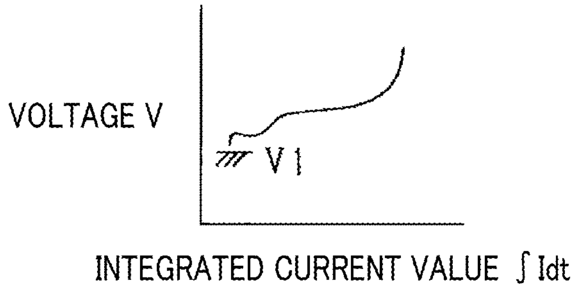
FIG. 7 is a graph illustrating a voltage threshold.

Meanwhile, when charging of the lithium-ion battery 41 is determined to be started in the determination at S10 (YES at S10), whether the voltage of the lithium-ion battery 41 is higher than a voltage threshold V1 is determined (S11). As shown in FIG. 7, the integrated current value increases when charging is started, and the voltage of the lithium-ion battery 41 increases in accompaniment thereto. Here, a condition is that the voltage of the lithium-ion battery 41 at the start of charging is higher than the voltage threshold V1.

Figure 8:
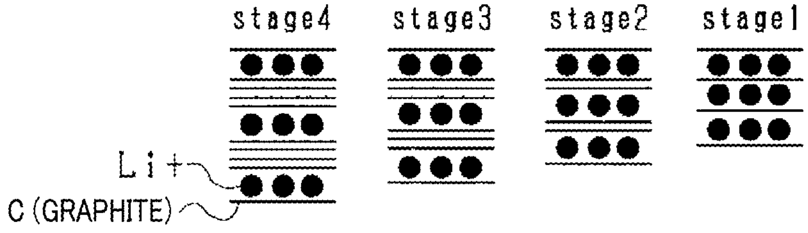
FIG. 8 is a schematic diagram illustrating each stage of a negative electrode.

As shown in FIG. 8, in the lithium-ion battery 41, lithium ions are stored in interlayers of a layered structure of graphite. In the lithium-ion battery 41, a stage of the negative electrode changes depending on a number of interlayers in which the lithium ions are not stored that are present between two interlayers in which the lithium ions are stored. Specifically, in stage 1, the lithium ions are stored in each interlayer of the graphite. In stage 2, a single interlayer in which the lithium ions are not stored is present between two interlayers in which the lithium ions are stored. In stage 3, two interlayers in which the lithium ions are not stored are present between two interlayers in which the lithium ions are stored. In stage 4, three interlayers in which the lithium ions are not stored are present between two interlayers in which the lithium ions are stored.

Figure 9:
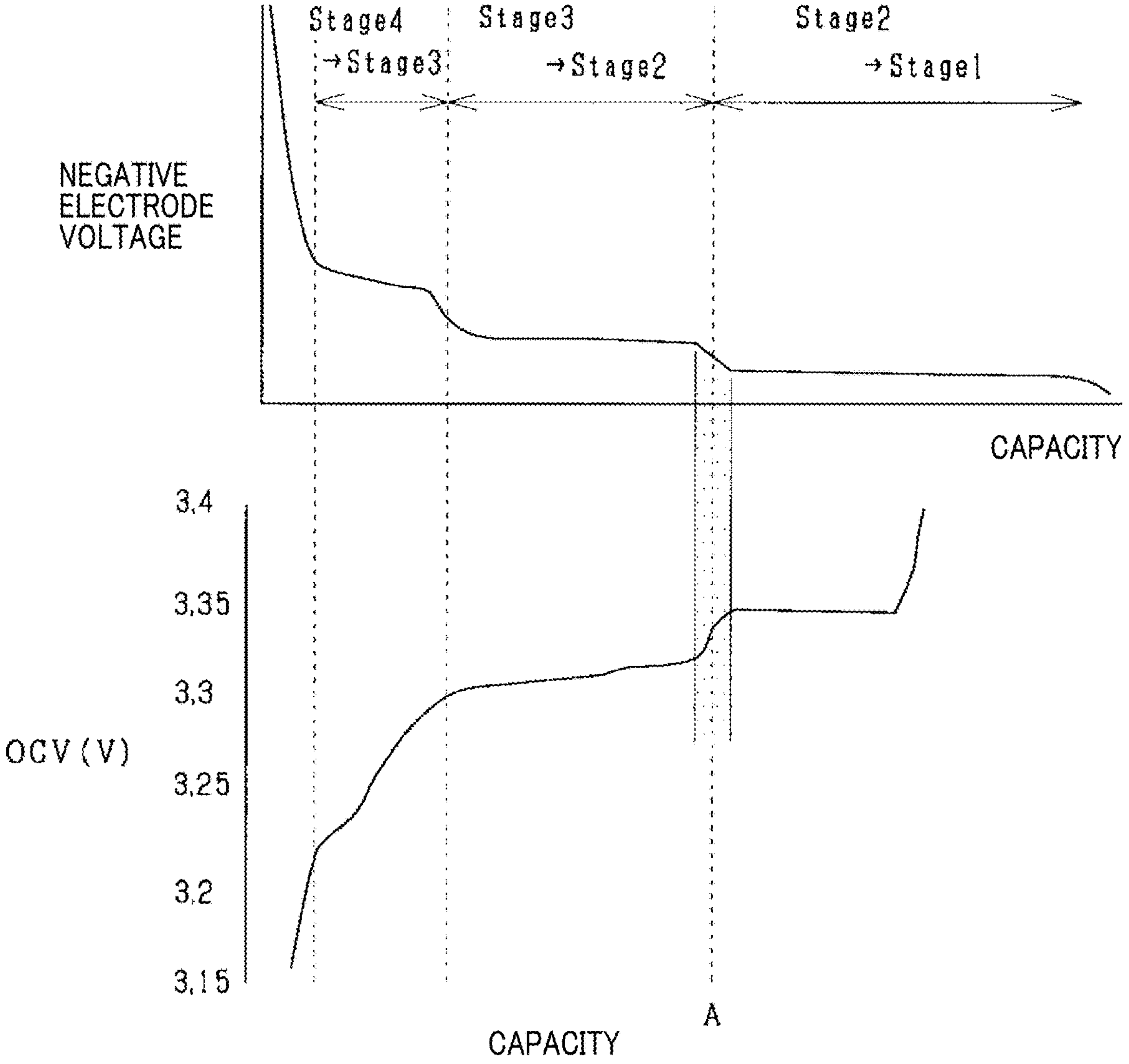
FIG. 9 is a graph illustrating a relationship between the stages of the negative electrode, the OCV, and the capacity A.

FIG. 9 is a graph of a relationship between the stages of the negative electrode, the OCV, and the capacity A. The capacity A at which the OCV significantly changes (the rate of change of the OCV becomes the maximum value) corresponds to a portion between a region in which stage 3 and stage 2 are both present and a region in which stage 2 and stage 1 are both present.

Figure 10:
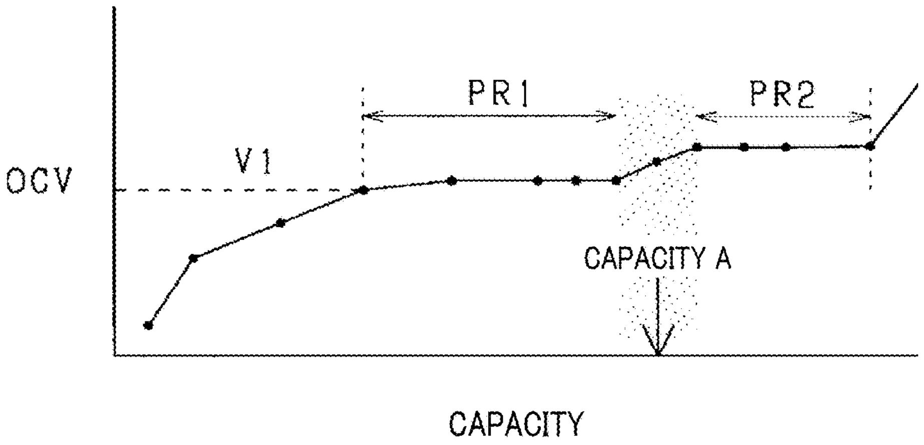
FIG. 10 is a graph illustrating a relationship between the capacity of the lithium-ion battery, the OCV, and the voltage threshold.

As shown in FIG. 10, the rate of change Rv of the OCV of the lithium-ion battery 41 relative to the capacity becomes the maximum value as a result of structural changes in the negative electrode of the lithium-ion battery 41 in a portion between two plateau regions PR1 and PR2 (low rate-of-change portions) in which the rate of change Rv of the OCV is equal to or less than a predetermined rate of change. Therefore, when the voltage of the lithium-ion battery 41 is lower than the plateau region PR1 having the lower OCV, the maximum value of the rate of change Rv of the OCV due to structural changes in the negative electrode of the lithium-ion battery 41 does not occur. Therefore, the voltage threshold V1 is set to a minimum voltage of the lithium-ion battery 41 in the plateau region PR1 of the two plateau regions PR1 and PR2.

Returning to FIG. 6, when the voltage of the lithium-ion battery 41 is determined to not be higher than the voltage threshold V1 in the determination at S11 (NO at S11), the series of processes is ended (END).

Meanwhile, when the voltage of the lithium-ion battery 41 is determined to be higher than the voltage threshold V1 in the determination at S11 (YES at S11), calculation of the rate of change of the voltage of the lithium-ion battery 41 is started (S12). Specifically, a derivative (the rate of change of the voltage relative to the capacity of the lithium-ion battery 41) of the integrated current value of the voltage is calculated (see FIG. 11).

Next, the current and the time from the start of charging are integrated, and the integrated current value is calculated (S13).

Figure 11:
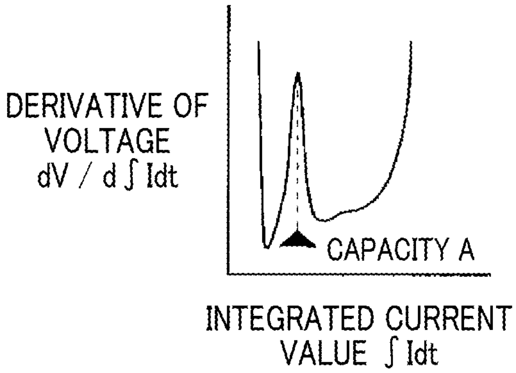
FIG. 11 is a graph of an aspect in which the capacity A is detected based on a maximum value of a derivative of the voltage.

Next, whether the rate of change of the voltage has a maximum value is determined (S14). Specifically, as shown in FIG. 11, whether the derivative of the integrated current value of the voltage is the maximum value is determined. When the rate of change of the voltage is determined to not have a maximum value (NO at S14), the process at S14 is performed again. Here, when charging of the lithium-ion battery 41 (battery 40) is ended while the process at S14 is being performed, this series of processes is ended.

Figure 12:
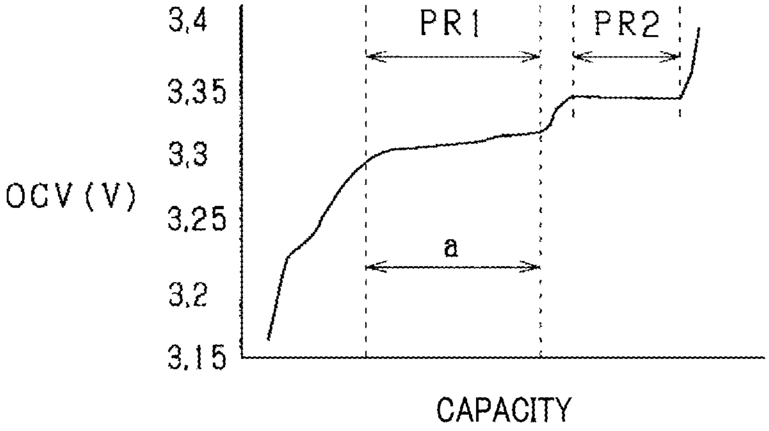
FIG. 12 is a graph illustrating a predetermined value a for determining a magnitude of an integrated current value.

Meanwhile, when the rate of change of the voltage is determined to have a maximum value in the determination at S14 (YES at S14), whether the integrated current value is equal to or less than a predetermined value a is determined (S15). As shown in FIG. 12, the predetermined value a is set to be equal to or less than a capacity corresponding to a width of the plateau region PR1. For example, half or two-thirds of the capacity corresponding to the width of the plateau region PR1 can be used. When the integrated current value is determined to not be equal to or less than the predetermined value a in this determination (NO at S15), this series of processes is ended (END).

Meanwhile, when the integrated current value is determined to be equal to or less than the predetermined value a in the determination at S15 (YES at S15), detection of the capacity A is confirmed (S16). Specifically, as shown in FIG. 11, when the derivative of the voltage is the maximum value, the capacity of the lithium-ion battery 41 at this time is detected (estimated) to be the capacity A (a remaining quantity corresponding to a portion between two minimum values).

Next, the current and the time from when the derivative of the voltage becomes the maximum value are integrated, and the integrated current value is calculated (S17).

Next, whether full charge of the lithium-ion battery 41 is detected is determined (S18). When full charge of the lithium-ion battery 41 is determined to not be detected in this determination (NO at S18), the process at S18 is performed again.

Meanwhile, when full charge of the lithium-ion battery 41 is determined to be detected in the determination at S18 (YES at S18), the SOH is calculated (S19). Specifically, the integrated current value calculated in the process at S17 is added to the capacity A and the capacity at the time of detection of full charge is calculated as the current full capacity. The current SOH is calculated by an expression SOH [%]=100×(current full capacity/full capacity when new) of the lithium-ion battery 41. Subsequently, this series of processes is ended (END).

Here, this series of processes is performed for each lithium-ion battery 41. In addition, the processes at S10 to S15 correspond to processes as a determination unit. The conditions at S13 to S15 correspond to a predetermined condition. The process at S16 corresponds to a process as an estimation unit.

The present embodiment described in detail above has the following advantages.

The discloser of the present invention has focused on the capacity when the rate of change of the voltage of the lithium-ion battery 41 during charging becomes the maximum value deviating from the capacity A, when the amount of change (referred to, hereafter as a "capacity change amount from the start of charging") in the capacity (integrated current value) from the start of charging until the rate of change of the voltage becomes the maximum value increases. In this regard, the determination unit 52 determines that a predetermined condition that the amount of change in the capacity from the start of charging of the lithium-ion battery 41 until the rate of change of the voltage becomes the maximum value is equal to or less than the predetermined value a is met. Therefore, the determination unit 52 can determine that the capacity change amount from the start of charging is not large based on the amount of change in the capacity from the start of charging until the rate of change of the voltage becomes the maximum value.

When determination unit 52 determines that the predetermined condition is met, the estimation unit 53 estimates the capacity corresponding to a portion between two minimum values of the rate of change of the voltage during charging of the lithium-ion battery 41 as the capacity of the lithium-ion battery 41. In addition, a maximum value is present between the two minimum values of the rate of change of the voltage during charging, and the capacity corresponding to the portion between the two minimum values is close to the capacity A corresponding to the maximum value. Therefore, the capacity close to the capacity A can be estimated as the capacity of the lithium-ion battery 41 in a state in which the capacity change amount from the start of charging is not large. Consequently, decrease in accuracy with which the capacity of the lithium-ion battery 41 is estimated can be suppressed.

The capacity of the lithium-ion battery 41 can be expressed by the integrated current value obtained by the current and the time being integrated. As a result of a configuration such as this, the capacity can be calculated using a general-purpose element such as the current sensor 31 that detects a current, or a clock of the CPU.

The predetermined value a is set to be less than the capacity of the lithium-ion battery 41 corresponding to the width of the plateau region PR1 having the lower voltage of the two plateau regions PR1 and PR2 in which the rate of change of the voltage is equal to or less than the predetermined rate of change. Therefore, the capacity of the lithium-ion battery 41 can be estimated in a state in which the capacity change amount from the start of charging is less than the capacity corresponding to the width of the plateau region PR1 having the lower voltage. Consequently, during charging, when the rate of change in the voltage is the maximum value, the capacity can be suppressed from deviating from the capacity A. Decrease in the accuracy with which the capacity of the lithium-ion battery 41 is estimated can be suppressed.

The predetermined condition includes the voltage of the lithium-ion battery 41 being higher than a lowest voltage (voltage threshold V1) of the lithium-ion battery 41 in the plateau region PR1 having the lower voltage of the lithium-ion battery 41, of the two plateau regions PR1 and PR2 in which the rate of change in the voltage is equal to or less than the predetermined rate of change. As a result of a configuration such as this, the maximum value of the rate of change of the voltage due to structural changes in the positive electrode of the lithium-ion battery 41 being erroneously determined to be the maximum value of the rate of change of the voltage due to structural changes in the negative electrode can be suppressed.

The full capacity of the current lithium-ion battery 41 can be calculated by the integrated current value in which the current and the time are integrated from when the capacity A of the lithium-ion battery 41 is estimated until the lithium-ion battery 41 meets a full charge condition being added to the capacity A of the lithium-ion battery 41 estimated by the estimation unit 53. In addition, the SOH (state of degradation) of the lithium-ion battery 41 can be calculated by a ratio of the full capacity of the current lithium-ion battery 41 relative to the full capacity of a new lithium-ion battery 41 being calculated.

The capacity A is a capacity corresponding to a portion between the region in which stage 3 and stage 2 of the negative electrode are both present and the region in which stage 2 and stage 1 are both present. As a result of the above-described configuration, the capacity A can be prescribed with high accuracy based on the stage of the negative electrode of the lithium-ion battery 41.

Here, the first embodiment can also be modified in the following manner. Sections identical to those according to the first embodiment are given the same reference numbers. Descriptions thereof are thereby omitted.

The capacity A can also be the capacity corresponding to a portion between the plateau regions PR1 and PR2. As a result of a configuration such as this, the capacity A can be prescribed with high accuracy based on the plateau regions PR1 and PR2.

The capacity A (specific remaining quantity) when the rate of change of the voltage becomes the maximum value can also be prescribed by the lithium-ion battery 41 being discharged to a capacity of zero from when the rate of change Rv of the voltage becomes the maximum value.

Figure 13:
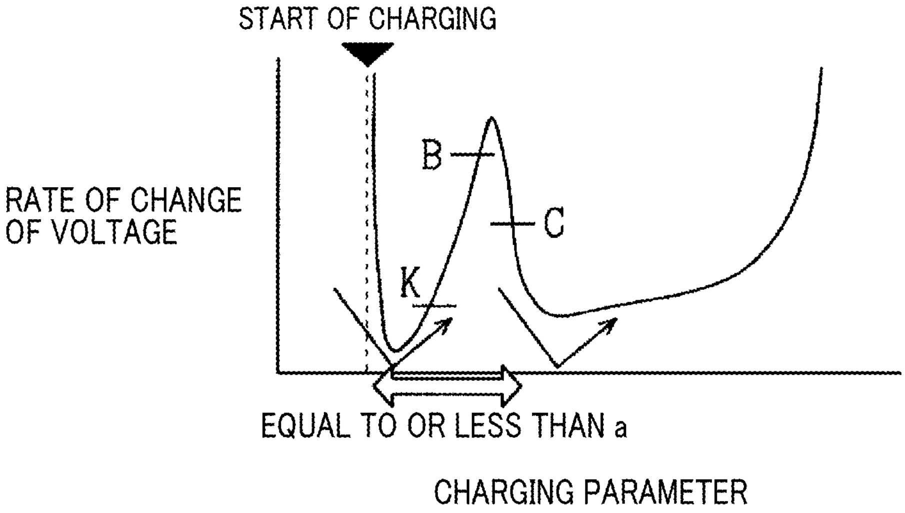
FIG. 13 is a graph illustrating a variation example of detection of the capacity of the lithium-ion battery.

As shown in FIG. 13, the determination unit 52 can also determine that the rate of change of the voltage has become the maximum value when, after charging of the lithium-ion battery 41 is started, the rate of change of the voltage exceeds a second predetermined value B that is greater than a first predetermined value K from a state of being less than the first predetermined value K, and subsequently becomes less than a third predetermined value C that is less than the second predetermined value B. The charging parameter is a parameter correlated with charging time. Time, the capacity of the lithium-ion battery 41, the integrated current value, the SOC of the lithium-ion battery 41, the temperature of the lithium-ion battery 41, an increase in temperature of the lithium-ion battery 41, an impedance of the lithium-ion battery 41, or the like can be used. The predetermined values K, B, and C are set in correspondence to a period from when the rate of change of the voltage changes from decreasing to increasing until the rate of change of the voltage changes from decreasing to increasing. As a result of a configuration such as this, the rate of change of the voltage being the maximum value can be easily determined based on a comparison of magnitude between the rate of change of the voltage and the three predetermined values K, B, and C. Here, according to the first embodiment as well, the above-described charging parameters can be used in addition to the integrated current value.

Second Embodiment

A second embodiment will be described below, mainly focusing on differences with the first embodiment. Sections that are identical to those according to the first embodiment are given the same reference numbers. Descriptions thereof are thereby omitted.

Figure 14:
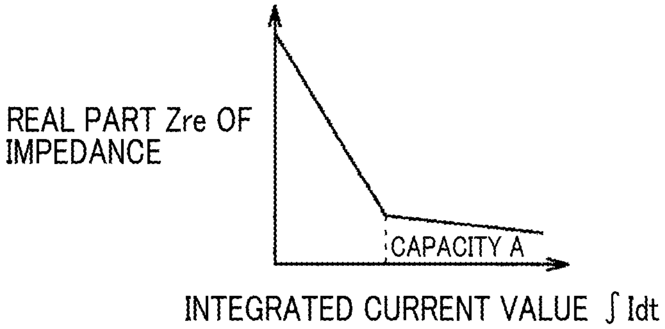
FIG. 14 is a graph illustrating a relationship between the integrated current value and a real part of impedance.

When a determination is made regarding the rate of change of the voltage of the lithium-ion battery 41 relative to the capacity (integrated current value) becoming the maximum value, the maximum value becomes difficult to differentiate if the current with which the lithium-ion battery 41 is charged is greater than a predetermined current. In this regard, as shown in FIG. 14, the discloser of the present invention has focused on a rate of change of a real part Zre (impedance) of an impedance of the lithium-ion battery 41 relative to the capacity significantly changing with respect to the capacity A at which the rate of change of the voltage becomes the maximum value during charging of the lithium-ion battery 41. Here, the impedance can be calculated based on an amplitude of an alternating-current voltage and an amplitude of an alternating-current current.

A reason the rate of change of the real part Zre of the impedance changes is because reactive heat during charging decreases as a result of the stage of the negative electrode changing. Temperature increase becomes gradual as a result of the decrease in reactive heat, and decrease in the real part Zre of the impedance also becomes gradual as a result of the temperature increase becoming gradual.

Figure 15:
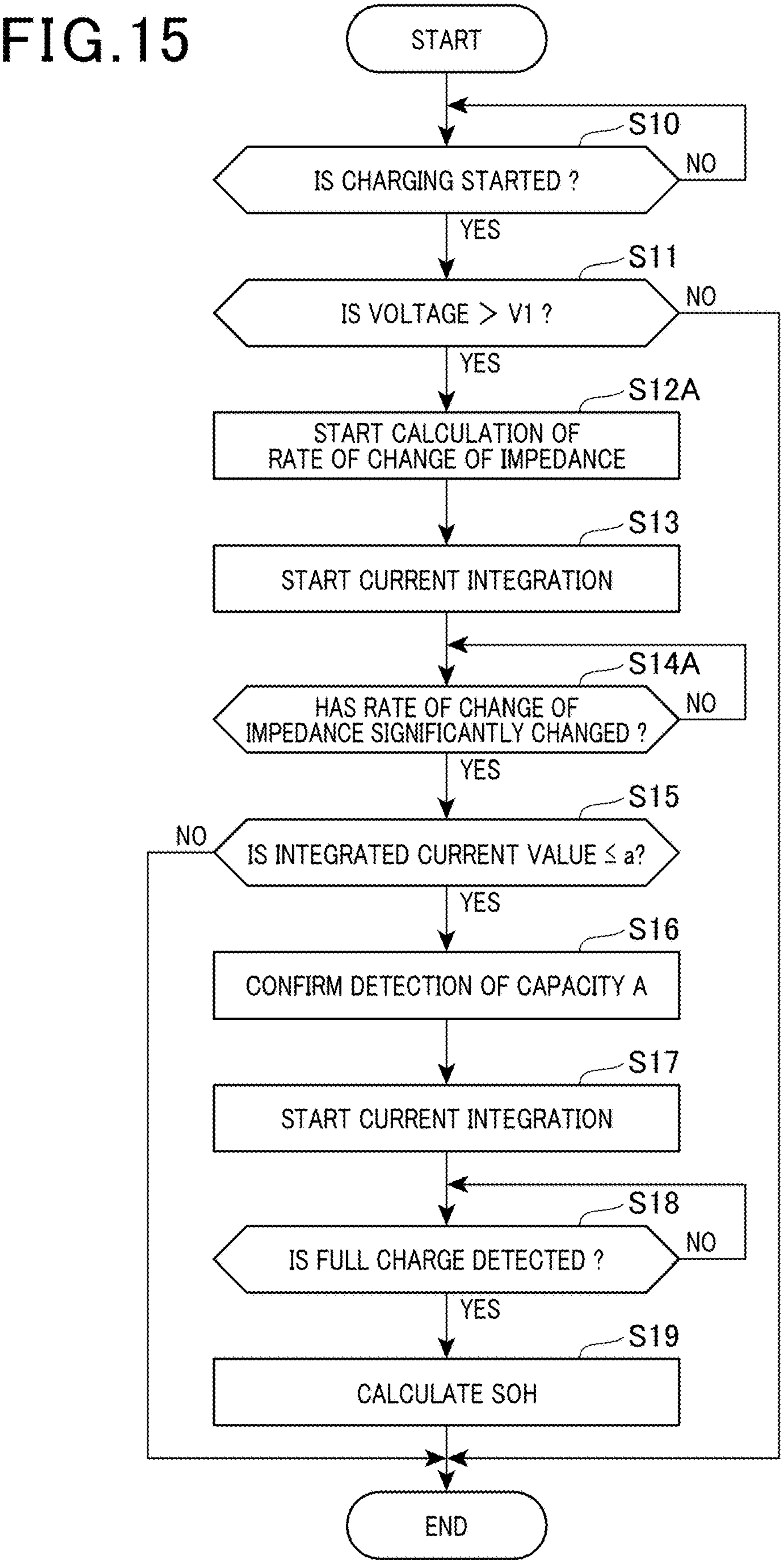
FIG. 15 is a flowchart illustrating a variation example of the processes for capacity A detection and SOH calculation.
Figures 16, 17:
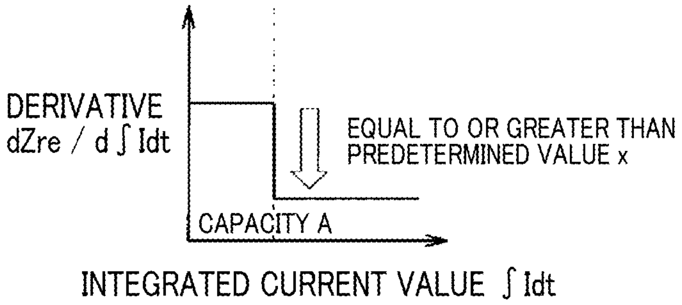

Therefore, the determination unit 52 determines that the rate of change of the voltage has become the maximum value when the rate of change of the impedance of the lithium-ion battery 41 relative to the capacity changes beyond a certain degree. Specifically, as shown in FIG. 15, instead of the process at S12 in FIG. 6, calculation of the real part Zre of the impedance of the lithium-ion battery 41 is started (S12A). Specifically, the derivative (the rate of change of the impedance relative to the capacity of the lithium-ion battery 41) of the integrated current value of the real part Zre of the impedance is calculated (see FIG. 16). In addition, instead of the process at S14 in FIG. 6, whether the rate of change of the real part Zre of the impedance has significantly changed is determined (S14A). Specifically, as shown in FIG. 16, whether the derivative of the integrated current value of the real part Zre of the impedance has changed by an amount equal to or greater than a predetermined value x is determined. As a result of a configuration such as this, even if the current with which the lithium-ion battery 41 is charged is greater than the predetermined current, a maximum value of the rate of change of the voltage of the lithium-ion battery 41 relative to the capacity can be detected.

Here, instead of the real part Zre of the impedance of the lithium-ion battery 41, an imaginary part Zim of the impedance, an absolute value of the impedance, or a phase of the impedance can also be used. In addition, instead of the rate of change of the real part Zre of the impedance, a rate of change of a temperature of the lithium-ion battery 41 can also be used.

Third Embodiment

A third embodiment will be described below, mainly focusing on differences with the first embodiment. Sections that are identical to those according to the first embodiment are given the same reference numbers. Descriptions thereof are thereby omitted.

As described above, when the capacity change amount from the start of charging increases, the capacity when the rate of change of the voltage becomes the maximum value during charging deviates from the capacity A. However, even in this case, the capacity of the lithium-ion battery 41 is preferably able to be estimated upon suppression of occurrence of issues, rather than the capacity of the lithium-ion battery 41 not being able to be estimated.

Therefore, when the integrated current value is determined to not be equal to or less than the predetermined value a (the predetermined condition is not met) in the process at S15 in FIG. 6 and FIG. 15 (NO at step S15), the BMU 50 may estimate, as the capacity of the lithium-ion battery 41, a capacity in which the capacity (such as the capacity A) corresponding to a portion between two minimum values of the rate of change of the voltage during charging of the lithium-ion battery 41 is reduced. As a result of a configuration such as this, the capacity of the lithium-ion battery 41 is estimated to be less than that when the integrated current value a is equal to or less than the predetermined value a (the predetermined condition is met), when the integrated current value is not equal to or less than the predetermined value a. Consequently, even in cases in which the accuracy with which the capacity of the lithium-ion battery 41 is estimated may decrease, the capacity of the battery can be suppressed from being depleted earlier than expected, and the capacity of the lithium-ion battery 41 can be estimated.

Here, when the integrated current value is determined to not be equal to or less than the predetermined value a (NO at S15), the amount by which the estimated capacity of the lithium-ion battery 41 is decreased can be increased as a charging current increases or increased as the temperature of the lithium-ion battery 41 decreases.

Furthermore, the first to third embodiments can also be modified in the following manner. Sections identical to those according to the first to third embodiments are given the same reference numbers. Descriptions thereof are thereby omitted.

The process at S19 in FIG. 6 and FIG. 15 can be omitted.

Capacity unevenness is more easily resolved as the temperature of the lithium-ion battery 41 increases and is less easily resolved as the temperature of the lithium-ion battery 41 decreases. Therefore, in the process at S15 in FIG. 6 and FIG. 15, the predetermined value a for determining the magnitude of the integrated current value may be set to a smaller value (a smaller amount of change) as the temperature of the lithium-ion battery 41 decreases. Specifically, the predetermined value a is set based on a table shown in FIG. 17. As a result of a configuration such as this, the amount of change in the integrated current value from the start of charging can be required to be smaller (the capacity change amount can be required to be smaller) as the temperature of the lithium-ion battery 41 decreases. Consequently, even in cases in which the temperature of the lithium-ion battery 41 is low, decrease in the accuracy with which the capacity of the lithium-ion battery 41 is detected (estimated) can be suppressed. Here, the temperature of the lithium-ion battery 41 may be measured by a temperature sensor or the like attached to the lithium-ion battery 41. Alternatively, an atmospheric temperature measured by an atmospheric temperature sensor may be used as the temperature of the lithium-ion battery 41. In addition, the capacity of the lithium-ion battery 41 when the rate of change of the voltage or the rate of change of the impedance (predetermined parameter) changes in a specific manner can also be estimated as the capacity A that is corrected based on the temperature of the lithium-ion battery 41.

Capacity unevenness more easily occurs as the current with which the lithium-ion battery 41 is charged increases and less easily occurs as the current with which the lithium-ion battery 41 is charged decreases. Therefore, the predetermined value a may be set to a smaller amount of change as the current with which the lithium-ion battery 41 is charged increases. As a result of a configuration such as this, the capacity change amount from the start of charging can be required to be smaller as the current with which the lithium-ion battery 41 is charged increases. Consequently, even in cases in which the current with which the lithium-ion battery 41 is charged is large, decrease in the accuracy with which the capacity of the lithium-ion battery 41 is estimated can be suppressed.

The SOC can also be used as the remaining quantity of the lithium-ion battery 41, instead of the integrated current value. In addition, the amount of change in the SOC from the start of charging of the lithium-ion battery 41 until the rate of change of the voltage becomes the maximum value can be determined to be equal to or less than a predetermined amount of change using the SOC (charging parameter). Furthermore, when the rate of change Rv (predetermined parameter) of the voltage relative to the SOC becomes the maximum value (changes in a specific manner), the remaining quantity of the lithium-ion battery 41 at this time can be estimated to be a specific SOC (specific remaining quantity). The specific SOC is an SOC corresponding to the capacity A.

As the lithium-ion battery 41, a ternary lithium-ion battery using a lithium-containing metal oxide containing elements Co, Mn, and Ni in the positive-electrode active material can also be used.

While the present disclosure has been described with reference to embodiments thereof, it is to be understood that the disclosure is not limited to the embodiments and constructions. The present disclosure is intended to cover various modification examples and modifications within the range of equivalency. In addition, various combinations and configurations, and further, other combinations and configurations including more, less, or only a single element thereof are also within the spirit and scope of the present disclosure.

What is claimed is:

1. A battery remaining quantity estimation apparatus that estimates a remaining quantity of a secondary battery based on a charging parameter correlated with charging time of the secondary battery and a rate of change of a voltage of the secondary battery relative to the charging parameter, the battery remaining quantity estimation apparatus comprising:

a determination unit that determines whether a predetermined condition is met, the predetermined condition being that an amount of change in the charging parameter from the start of charging of the secondary battery until when the rate of change of the voltage becomes a maximum value is equal to or less than a predetermined amount of change; and an estimation unit that, in response to the determination unit determining that the predetermined condition is met, estimates a remaining quantity corresponding to a portion between two minimum values of the rate of change of the voltage during charging of the secondary battery as the remaining quantity of the secondary battery.

2. The battery remaining quantity estimation apparatus according to claim 1, wherein:

the charging parameter is an integrated current value in which current and time are integrated.

3. The battery remaining quantity estimation apparatus according to claim 1, wherein:

the predetermined amount of change is set to less than the charging parameter corresponding to a width of a low rate-of-change portion having a lower voltage of the secondary battery, of two low rate-of-change portions in which the rate of change of the voltage is equal or less than a predetermined rate of change.

4. The battery remaining quantity estimation apparatus according to claim 1, wherein:

the predetermined amount of change is set to a smaller amount of change as a temperature of the secondary battery decreases.

5. The battery remaining quantity estimation apparatus according to claim 1, wherein:

the predetermined amount of change is set to a smaller amount of change as a current with which the secondary battery is charged increases.

6. The battery remaining quantity estimation apparatus according to claim 1, wherein:

the determination unit determines that the rate of change of the voltage is a maximum value when, after the start of charging of the secondary battery, the rate of change of the voltage exceeds a second predetermined value that is greater than a first predetermined value from a state in which the rate of change is less than the first predetermined value and subsequently becomes less than a third predetermined value that is less than the second predetermined value.

7. The battery remaining quantity estimation apparatus according to claim 1, wherein:

the estimation unit estimates, as the remaining quantity of the secondary battery, a remaining quantity in which a remaining quantity corresponding to a portion between two minimum values of the rate of change of the voltage during charging of the secondary battery is decreased, in response to the determination unit determining that the predetermined condition is not met.

8. The battery remaining quantity estimation apparatus according to claim 1, wherein:

the determination unit determines that the rate of change of the voltage is a maximum value when a rate of change of a temperature of the secondary battery relative to the charging parameter or a rate of change of an impedance of the secondary battery relative to the charging parameter changes beyond a predetermined degree.

9. The battery remaining quantity estimation apparatus according to claim 1, wherein:

the predetermined condition includes the voltage of the secondary battery being higher than a lowest voltage of the secondary battery in the low rate-of-change portion having the lower voltage of the secondary battery, of two low rate-of-change portions in which the rate of change of the voltage is equal to or less than a predetermined rate of change.

10. The battery remaining quantity estimation apparatus according to claim 1, wherein:

a state of degradation of the secondary battery is calculated based on a remaining quantity of the secondary battery estimated by the estimation unit, an integrated current value in which current and time are integrated from when the remaining quantity of the secondary battery is estimated until the secondary battery meets a full-charge condition, and a full capacity of the secondary battery in a new state.

11. The battery remaining quantity estimation apparatus according to claim 1, wherein:

the secondary battery is a lithium-ion battery having a negative electrode containing graphite.

12. The battery remaining quantity estimation apparatus according to claim 11, wherein:

the secondary battery is a lithium-ion battery having a positive electrode containing lithium, iron, and phosphorus.

13. The battery remaining quantity estimation apparatus according to claim 2, wherein:

the predetermined amount of change is set to less than the charging parameter corresponding to a width of a low rate-of-change portion having a lower voltage of the secondary battery, of two low rate-of-change portions in which the rate of change of the voltage is equal or less than a predetermined rate of change.

14. The battery remaining quantity estimation apparatus according to claim 2, wherein:

the predetermined amount of change is set to a smaller amount of change as a temperature of the secondary battery decreases.

15. The battery remaining quantity estimation apparatus according to claim 2, wherein:

the predetermined amount of change is set to a smaller amount of change as a current with which the secondary battery is charged increases.

16. The battery remaining quantity estimation apparatus according to claim 2, wherein:

the determination unit determines that the rate of change of the voltage is a maximum value when, after the start of charging of the secondary battery, the rate of change of the voltage exceeds a second predetermined value that is greater than a first predetermined value from a state in which the rate of change is less than the first predetermined value and subsequently becomes less than a third predetermined value that is less than the second predetermined value.

17. The battery remaining quantity estimation apparatus according to claim 2, wherein:

the estimation unit estimates, as the remaining quantity of the secondary battery, a remaining quantity in which a remaining quantity corresponding to a portion between two minimum values of the rate of change of the voltage during charging of the secondary battery is decreased, in response to the determination unit determining that the predetermined condition is not met.

18. The battery remaining quantity estimation apparatus according to claim 2, wherein:

the determination unit determines that the rate of change of the voltage is a maximum value when a rate of change of a temperature of the secondary battery relative to the charging parameter or a rate of change of an impedance of the secondary battery relative to the charging parameter changes beyond a predetermined degree.

19. The battery remaining quantity estimation apparatus according to claim 2, wherein:

the predetermined condition includes the voltage of the secondary battery being higher than a lowest voltage of the secondary battery in the low rate-of-change portion having the lower voltage of the secondary battery, of two low rate-of-change portions in which the rate of change of the voltage is equal to or less than a predetermined rate of change.

20. The battery remaining quantity estimation apparatus according to claim 2, wherein:

a state of degradation of the secondary battery is calculated based on a remaining quantity of the secondary battery estimated by the estimation unit, an integrated current value in which current and time are integrated from when the remaining quantity of the secondary battery is estimated until the secondary battery meets a full-charge condition, and a full capacity of the secondary battery in a new state.

* * * * *